(12) United States Patent
Bishara et al.

(10) Patent No.: US 12,050,408 B2
(45) Date of Patent: Jul. 30, 2024

(54) OPTIMIZATION-BASED IMAGE PROCESSING FOR METROLOGY

(71) Applicant: Applied Materials, Inc., Santa Clara, CA (US)

(72) Inventors: Waheb Bishara, San Mateo, CA (US); Stephanie W. Chen, Fremont, CA (US); Bin Lin, Hangzhou (CN); Xinhuo Xiao, Hangzhou (CN)

(73) Assignee: Applied Materials, Inc., Santa Clara, CA (US)

( * ) Notice: Subject to any disclaimer, the term of this patent is extended or adjusted under 35 U.S.C. 154(b) by 482 days.

(21) Appl. No.: 17/416,329

(22) PCT Filed: Nov. 24, 2020

(86) PCT No.: PCT/CN2020/131045
§ 371 (c)(1),
(2) Date: Jun. 18, 2021

(87) PCT Pub. No.: WO2022/109767
PCT Pub. Date: Jun. 2, 2022

(65) Prior Publication Data
US 2022/0163898 A1   May 26, 2022

(51) Int. Cl.
*G03F 7/00*   (2006.01)
(52) U.S. Cl.
CPC ................. *G03F 7/70625* (2013.01)
(58) Field of Classification Search
CPC .................................................. G03F 7/70625
USPC .......................................................... 430/30
See application file for complete search history.

(56) References Cited

U.S. PATENT DOCUMENTS

| | | | |
|---|---|---|---|
| 6,768,983 | B1 | 7/2004 | Jakatdar et al. |
| 6,891,626 | B2 | 5/2005 | Niu et al. |
| 7,092,110 | B2 * | 8/2006 | Balasubramanian ........................ G01N 21/4788 250/559.22 |
| 10,572,697 | B2 | 2/2020 | Feng et al. |
| 2004/0017575 | A1 | 1/2004 | Balasubramanian et al. |
| 2014/0046646 | A1 | 2/2014 | Cao et al. |

FOREIGN PATENT DOCUMENTS

| | | |
|---|---|---|
| CN | 111095115 A | 5/2020 |
| WO | 2020160029 A1 | 8/2020 |

OTHER PUBLICATIONS

PCT International Search Report and Written Opinion for International Application No. PCT/CN2020/131045 mailed Aug. 23, 2021, 10 pages.

* cited by examiner

*Primary Examiner* — Christopher G Young
(74) *Attorney, Agent, or Firm* — Lowenstein Sandler LLP

(57) ABSTRACT

One or more images of a device feature are acquired using an imaging tool. A geometrical shape is defined encompassing the relevant pixels of each image, where the geometrical shape is represented in terms of one or more parameters. A cost function is defined whose variables comprise the one or more parameters of the geometrical shape. For each image, numerical optimization is applied to obtain optimal values of the one or more parameters for which the cost function is minimized. The optimal values of the one or more parameters are reported as metrology data pertaining to the device feature.

20 Claims, 6 Drawing Sheets

OPTIMIZATION-BASED IMAGE PROCESSING FOR METROLOGY

TECHNICAL FIELD

Embodiments of the disclosure relate generally to measuring fine features in a device on a semiconductor wafer, and particularly to obtain precise metrology data by image processing using mathematical optimization.

BACKGROUND

The manufacturing process of semiconductor integrated circuits requires high resolution measurements of fine features for accurate metrology. Metrology data is often used to tune process parameters to improve manufacturing yield and uniformity. Taking high-resolution images and measuring dimensions (including critical dimensions, CD) directly from the images is one way of producing metrology data. However, direct measurements are negatively impacted by noise, which can be the image noise inherent to a raw image, measurement noise (e.g., image artifact that is not present in the original imaged object but is introduced by the limitations of the imaging equipment), and/or other local artifacts (e.g., localized residue or debris).

Image processing techniques are used to improve measurement accuracy. One such image processing technique is edge detection. In the edge detection technique, smaller regions of pixels in a raw image are encompassed by contours around detected edges. But the edge-detection technique is particularly vulnerable to image noises and artifacts. This disclosure proposes a method for obtaining measurements that are the results of a numerical optimization problem, and much more robust against noises.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In one aspect of the disclosure, one or more images of a device feature are acquired using an imaging tool. The imaging tool can be optical, electron beam or X-ray-based imaging tool, or any other imaging technique used to acquire image. A geometrical shape is defined encompassing the relevant pixels of each image, where the geometrical shape is represented in terms of one or more parameters. A cost function is defined whose variables comprise the one or more parameters of the geometrical shape. For each image, numerical optimization is applied to obtain optimal values of the one or more parameters for which the cost function is minimized. The optimal values of the one or more parameters are reported as metrology data pertaining to the device feature.

The geometrical shape can be an ellipse, where the one or more parameters representing the ellipse comprises a major axis diameter of the ellipse, a minor axis diameter of the ellipse, coordinates of a center of the ellipse, and angular direction of the ellipse. A single ellipse may be sufficient when there is a lighter background with a dark pixels in the center representing the image of the feature. The dark pixels can be encompassed by the elliptical contour.

In another aspect, the cost function can be tailored such that the numerical optimization yields one or more parameters of an elliptical ring that encompasses an annulus of relatively brighter pixels in a relatively dark background in an image with low signal to noise ratio.

In yet another aspect, the device feature can comprise a three-dimensional (3D) hole having a top opening, and a bottom surface that is partially obscured from being directly imaged by the imaging tool because of sloped sidewalls connecting the top opening and the bottom surface of the hole. A top ellipse and a bottom ellipse are defined to respectively encompass a first set of pixels representing the top opening and a second set of pixels representing the bottom surface of the hole. Incorporating known (i.e. measured a priori) dimensions to define the bottom ellipse compensates for the bottom surface being obscured from being directly imaged due to the sloped sidewalls. The cost function is tailored such that the numerical optimization yields an offset value between the top ellipse and the bottom ellipse.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1C:
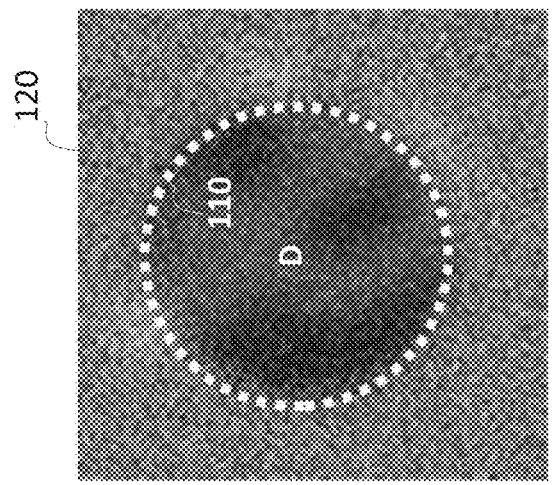
FIG. 1C illustrates an optimal ellipse superimposed on the original image of FIG. 1A, according to an embodiment of the present disclosure.

Embodiments of the present disclosure are directed to a novel approach for geometrical image measurements based on numerical optimization that is robust against high noise level present in the raw image or other types of image artifacts. The image artifacts can be introduced by the limitations of the imaging equipment, localized debris or residue, or other inherent characteristics of the device being imaged, such as an obscured feature.

One objective achieved by this disclosure is to produce metrology data for fine-featured electronic devices in a non-destructive way using images obtained from a variety of imaging tools, including, but not limited to electron beam (e-beam) inspection tool (e.g., scanning electron microscope (SEM)), optical imaging tools, X-ray-based imaging tools etc. The electronic devices may be advanced semiconductor devices formed on a wafer. The 3D features may have a lateral dimension in a range varying from a few nanometers to tens or hundreds of nanometers. Some semiconductor devices may have fine features not only with tight lateral dimension, but also with high aspect ratio (HAR). This disclosure is, however, not limited to any specific lateral dimension or any specific aspect ratio. Illustrative examples of device features being imaged include, but are not limited to, channel holes, slits, trenches etc. Specific examples of high aspect ratio features include circular memory holes in 3D NAND memory devices. Those skilled in the art can extrapolate the application of the disclosed technique to any other geometry. Examples of other geometries include trenches such as those used for shallow trench isolation of transistors. The 3D features may be isolated structures or part of an array of similar features.

Device features should be characterized well using detailed metrology to be able to tune process parameters. For example, as a process (such as an etching process or a deposition process) progresses, aspect ratio of the feature changes. As a particular illustration, in an etch process, the etch rate varies as the aspect ratio of a feature changes with time. Accurate characterization of device features enables effective tuning of the etch process parameters. Current approaches for device feature characterization use e-beam/optical/X-ray images along a vertical (or longitudinal) section, and/or transmission electron microscopy (TEM) images. These destructive imaging techniques usually provide only an image of a single planar section (longitudinal section) from which a limited number of device characterization metrics are obtained, which is unsuitable for high-volume manufacturing (HVM). The present disclosure addresses these and other shortcomings of the current methods by using mathematical optimization to measure device features from top-down imaging without having to destroy the wafer to expose a longitudinal cross section.

Advantages of the present approach include, but are not limited to, robustness to noise and image artifacts, flexibility in selecting measurement parameters, and flexibility in defining the cost function that is associated with the optimal values of the desired measurement metrics.

Figure 1B:
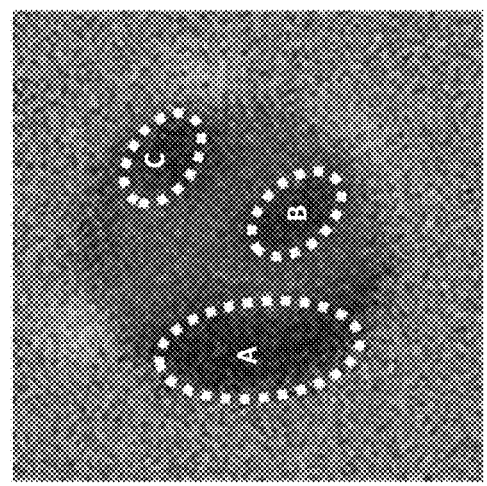
FIG. 1B illustrates elliptical contours superimposed on the original image of FIG. 1A to for a conventional edge-based detection technique.
Figure 1A:
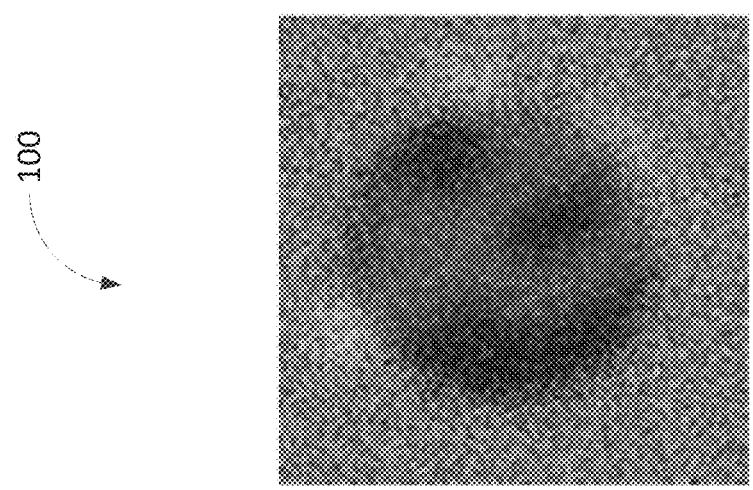
FIG. 1A illustrates a top view of an original image of a device feature (a memory hole).

As mentioned in the background section, one existing approach to provide metrology data in a non-destructive manner is to acquire top-down images and use image processing techniques based on edge detection. FIG. 1A shows a raw image 100 of the top view of a device feature with a circular geometry. FIG. 1B shows three regions (marked A, B, and C) of the image 100 that are identified by image processing, and individual contours (dotted outlines) are superimposed on the raw image along the detected edges of each of those smaller regions. FIG. 1B represents the state-of-the-art image-processing based metrology. In stark contrast to the currently used edge-detection-based approach, this disclosure discloses encompassing the entire region D of relevant pixels of the image 100 with a single geometrical contour 110 (as shown in FIG. 1C), and numerically find optimal parameters of the geometrical contour 110. This approach works well when the background 120 is relatively light and the feature is represented by relatively darker pixels within the region D.

Figure 2:
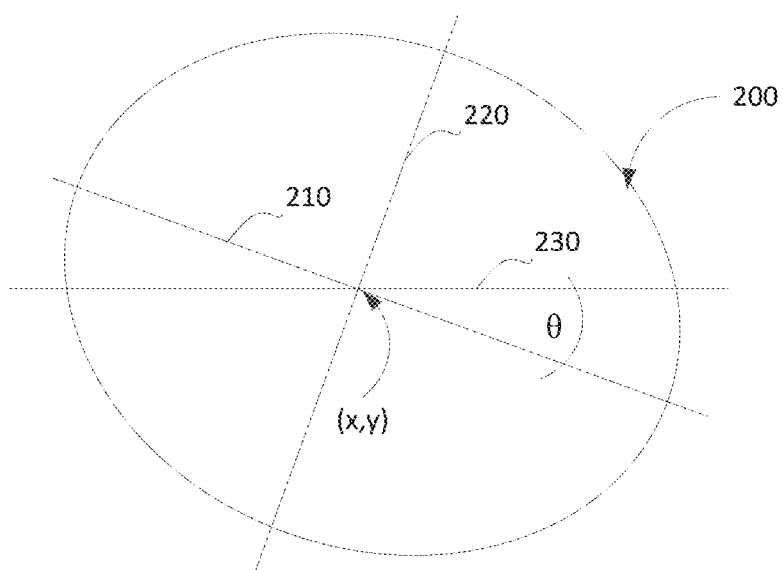
FIG. 2 illustrates parameters of an optimal ellipse to construct a cost function, according to embodiments of the present disclosure.

The geometrical contour 110 can be in the shape of an ellipse 200, as shown in FIG. 2. The parameters that define the ellipse 200 include length 'a' of major axis 210, length 'b' of minor axis 220, coordinates of the center (x,y), and the direction of the ellipse, for example the angle θ between the major axis 210 and a horizontal axis 230. A cost function can be defined in terms of the above parameters of the ellipse. For example, the cost function is defined as:

$$\text{cost}(x,y,a,b,\theta)=\text{Values}(x,y,a,b,\theta)-\lambda\,\text{Area}(a,b) \quad \text{(Equation 1)}$$

where, a=major axis diameter of the ellipse,
b=minor axis diameter of the ellipse,
(x, y) are coordinates of a center of the ellipse,
θ is the angle between a horizontal axis and the major axis of the ellipse, indicating an angular direction of the ellipse,
Area=area of the ellipse; and
λ is a tuning parameter for optimizing the cost function.

The cost function has two terms: a first term (Values(x, y,a,b,θ)) associated with grey evel values of pixels and a second term (λ Area(a,b)) associated with are of the ellipse. The tuning parameter λ is a coefficient that controls the tradeoff between the first term and the second term so that the resultant cost function is minimized. For example, the cost function's value reduces when the first term becomes smaller and the second term becomes larger. The second term becomes larger as the area of the ellipse becomes larger. The first term becomes smaller as the grey level values of the pixels reduce, i.e. the encompassed pixels are much darker than the lighter background surrounding the relevant pixels. This type of cost function is best suited for a first scenario with an image having a relatively high signal-to-noise ratio.

Figure 3B:
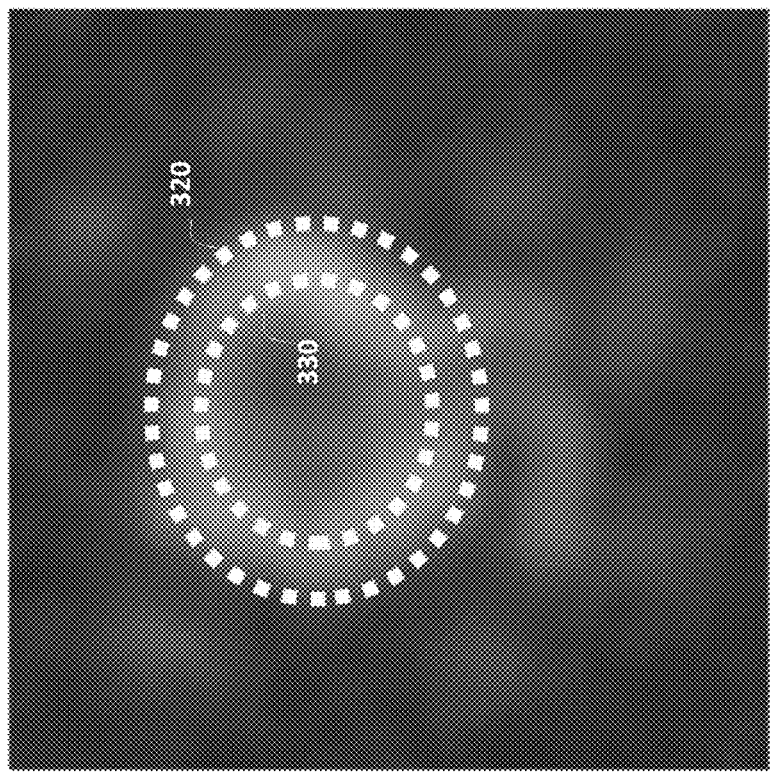
FIG. 3B illustrates construction of a cost function tailored for a bright elliptical ring with the dark background, according to embodiments of the present disclosure.
Figure 3A:
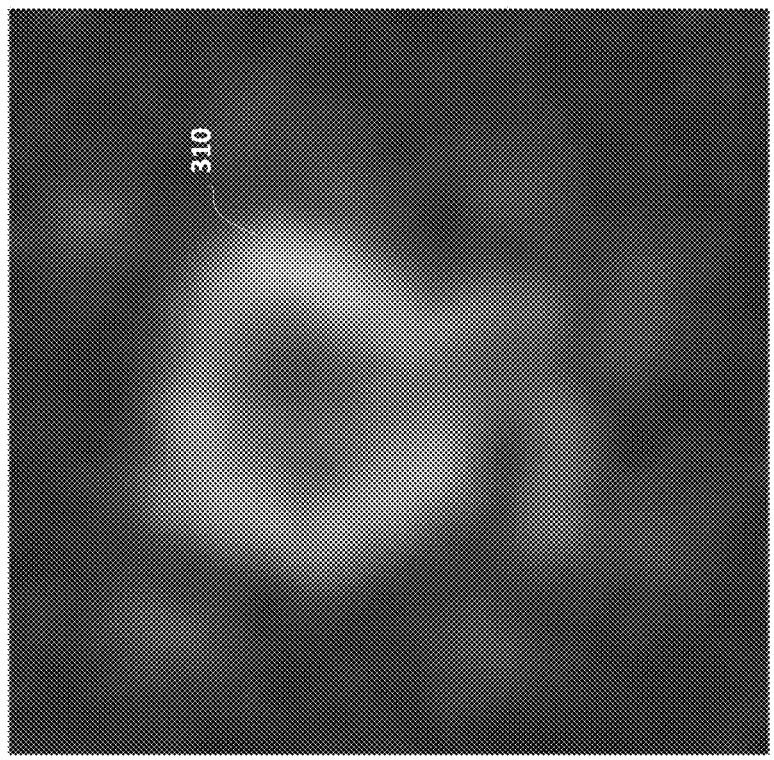
FIG. 3A illustrates a raw image of a feature showing an approximate bright elliptical ring of a certain width in a relatively dark background.

In a second scenario, a raw image may be quite noisy, i.e. the signal-to-noise ratio within an entire elliptical region may not be the most desirable cost function. For example, as shown in FIG. 3A, the raw image 300 has a darker background, but an approximately annular region 310 with brighter pixels exist within the image. For this type of scenario, defining two ellipses, an outer ellipse 320 and an inner ellipse 330, rather than one ellipse is a better approach, as shown in FIG. 3B. The two ellipses 320 and 330 collectively define an elliptical ring that surrounds the annular region 310 with brighter pixels. The cost function is tailored such that the numerical optimization yields one or more parameters of the elliptical ring. The parameters of the elliptical ring are then used as metrology data to tune an existing process. The parameters of the elliptical ring may include location (of the center of the two ellipses), width (i.e. difference between the radius of the outer ellipse and the radius of the inner ellipse) and directionality (orientation, i.e. angle of major axis with respect to a horizontal axis) of the ring.

In a third scenario, this disclosed numerical optimization technique can be used very effectively along with priori measurement data incorporated into the cost function. This is particularly useful for an example image of an etched hole (which can be a high-aspect-ratio 3D structure) with sloped sidewalls 440A and 440B, as depicted in the longitudinal view 400 shown in FIG. 4A. The hole is etched within the substrate body 420. The hole has a top opening 450 and a bottom surface 460 connected by the sidewalls 440A and 440B, which may deviate from the ideal parallel sidewalk 430A and 430B. Parallel sidewalls would have resulted if the etching process was ideal and there was no effect of the increasing depth of the hole as the etching process progressed.

Figure 4B:
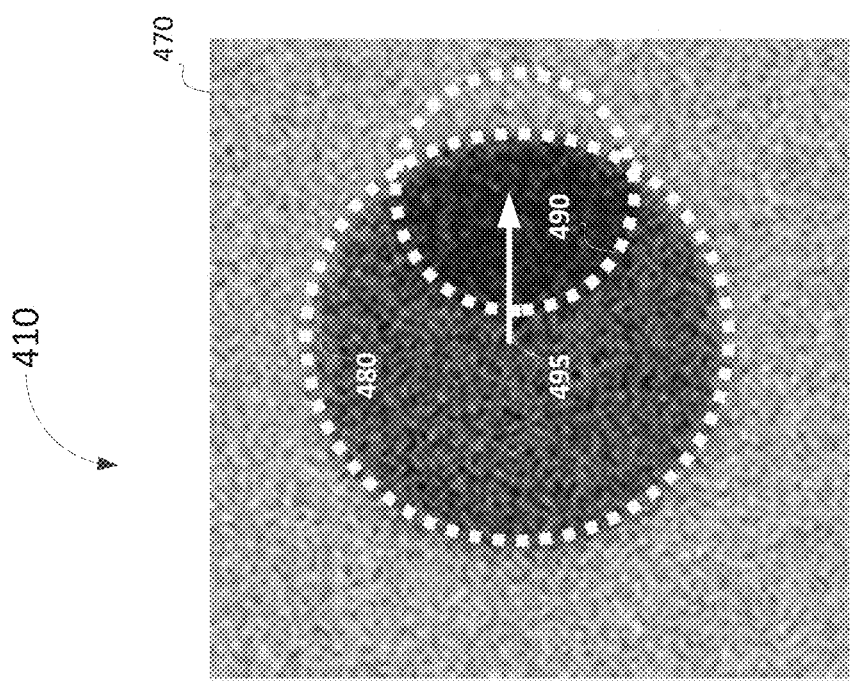
FIG. 4B illustrates optimal ellipses superimposed on an image of a top view of the memory whole shown schematically in FIG. 4A, according to an embodiment of the present disclosure.
Figure 4A:
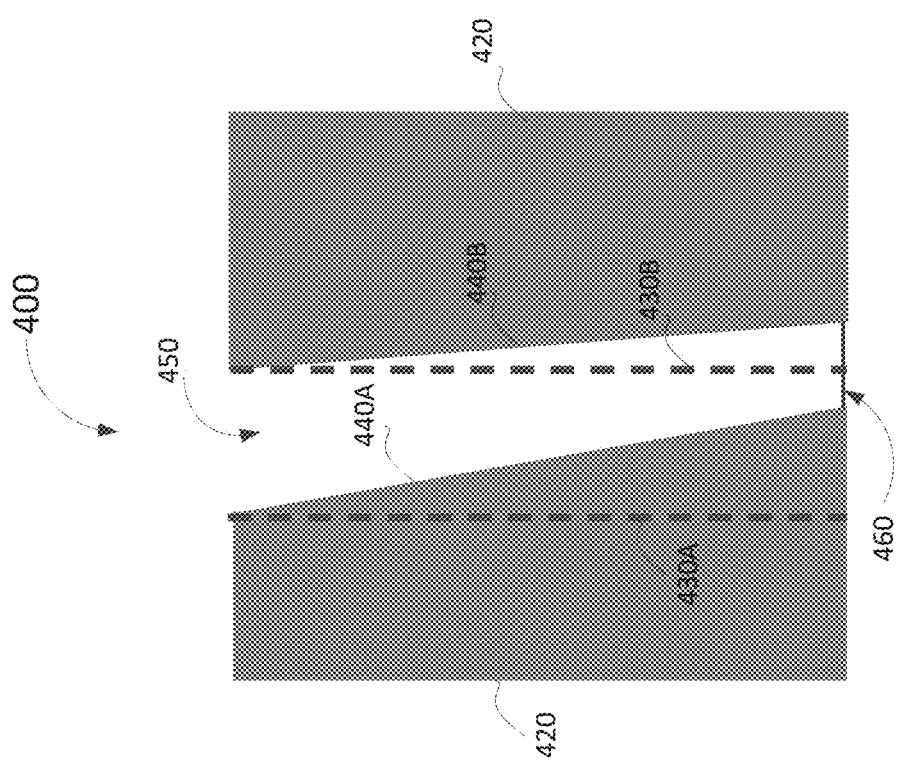
FIG. 4A illustrates a schematic longitudinal cross-sectional side view of a 3D memory hole with non-uniform sidewall slopes.

FIG. 4B shows a top view 410 of the imaged hole whose side view is shown in FIG. 4A. The top ellipse 480 encompasses pixels representing the top opening 450 and the bottom ellipse 490 encompasses pixels representing the bottom surface 460. Note that here also the background 470 is relatively lighter than the central region of darker pixels representing the hole (similar to FIG. 1C). Due to the sloped sidewall 440B, part of the bottom surface 460 is obscured from the line-of-sight of the imaging tool acquiring a top-down image. However, from prior measurement (which could be destructive or non-destructive measurement), dimension of the bottom surface is known. So the parameters of the bottom ellipse 490 can be partly dependent on prior dimensional knowledge of portions of features that are obscured. The cost function is tailored such that the numerical optimization yields an offset value 495 between the centers of the top ellipse 480 and the bottom ellipse 490. The offset value 495 can be an important metrology data based on which the process parameters are tuned. Therefore, despite the partial obscuring of the bottom surface, a reliable offset value can be produced by incorporating prior knowledge to the numerical optimization technique described herein.

Figure 5:
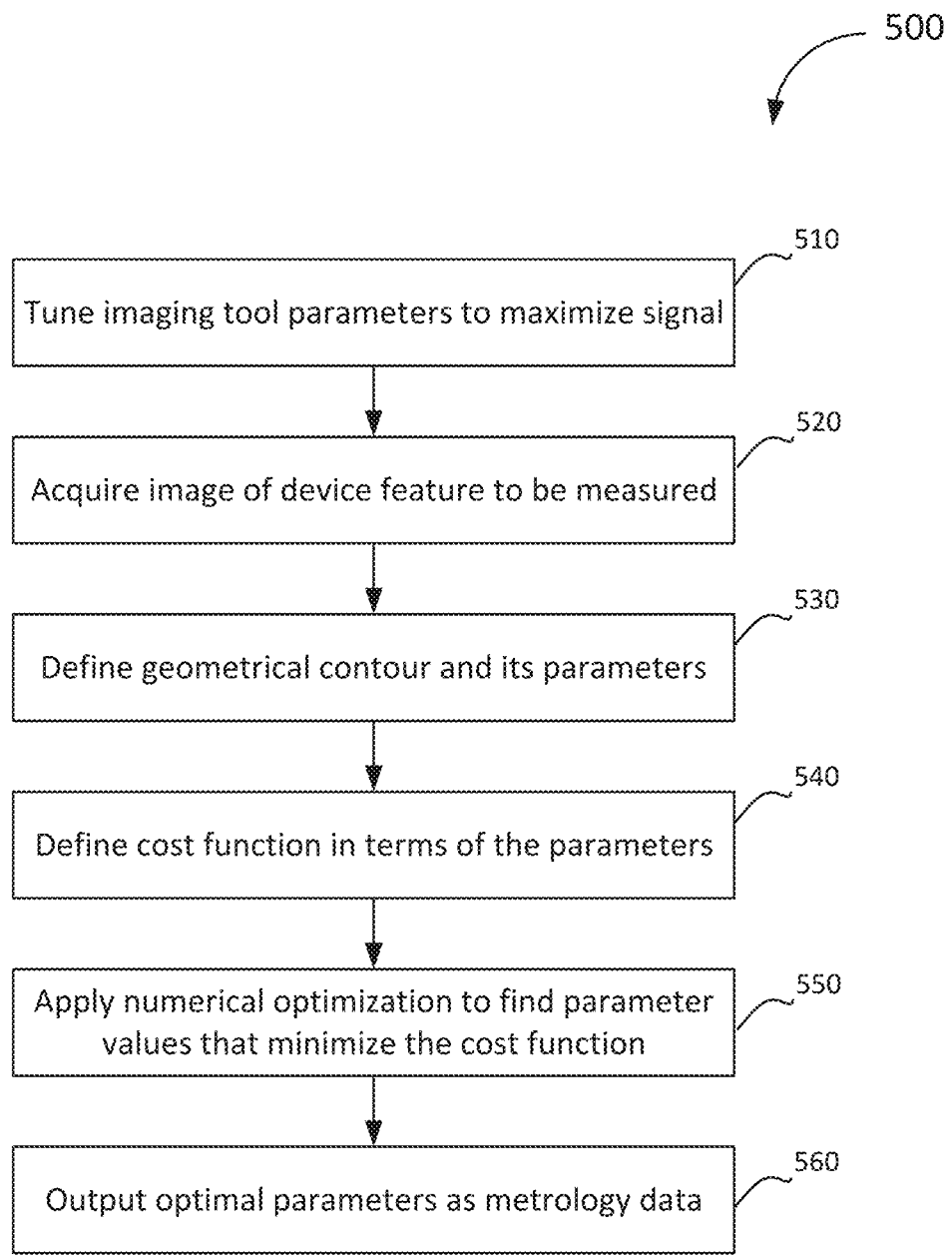
FIG. 5 shows a flowchart describing an example method of optimization-based image processing for metrology, according to an embodiment of the present disclosure.

FIG. 5 is a flow diagram of an example method 500 of numerical optimization based metrology data generation, in accordance with some embodiments of the present disclosure. The method 500 can be performed by processing logic that can include hardware (e.g., processing device, circuitry, dedicated logic, programmable logic, microcode, hardware of a device, integrated circuit, etc.), software e.g., instructions run or executed on a processing device), or a combination thereof. Although shown in a particular sequence or order, unless otherwise specified, the order of the processes in method 500 or other methods described herein with illustrative flowcharts can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In method 500, at block 505, optionally, imaging tool parameters can be adjusted to maximize signal-to-noise ratio before acquiring images. As mentioned above, the imaging tool can be electron-beam based, optics based or X-ray based. The scope of the disclosure is not limited at all by what type of imaging tool is used.

At block 520, images are acquired by the imaging tool of the device feature that is to be measured. For example, a diameter of a hole can be the critical dimension (CD) that is to be measured to generate metrology data. Typically, more than one images of the device feature are acquired.

At block 530, a geometrical contour of the measurement region and parameters of the contour are defined by a processing device. For example, if an ellipse is going to encompass the pixels of the imaged device feature, then parameters of the ellipse, e.g., major axis, minor axis, coordinates of the center, and directionality of the ellipse are defined, as described in FIG. 2.

At block 540, a cost function is defined in terms of the parameters of the chosen geometrical contour. An example of the cost function is given earlier at Equation 1. The first term of the equation can be the sum of all grey level values of the relevant pixels. The tuning parameter can be associated with a predetermined threshold grey level value, e.g. mean grey level value of all pixels in the raw image including the relevant pixels representing the device feature, and the background pixels representing the surrounding substrate. The cost function can be tailored to represent average pixel values inside an ellipse (e.g., FIG. 1C), pixels values inside an elliptical ring (e.g., FIG. 3B), displacement or offset between two elliptical contours (e.g., FIG. 4B), or any other cost function that is a convenient metrology metric that is useful for process control.

At block 550, a processing device applies numerical optimization technique to find values of the parameters for which the resulting cost function is minimized. One example of numerical optimization is based on Nelder-Mead method, but persons skilled in the art would appreciate that the scope of the disclosure is not limited by what specific optimization technique is used.

At block 560, the optimal values of the parameters for which the cost function is minimized are provided as an output. This output can be reported as the input data for a metrology-based process control tool.

Figure 6:
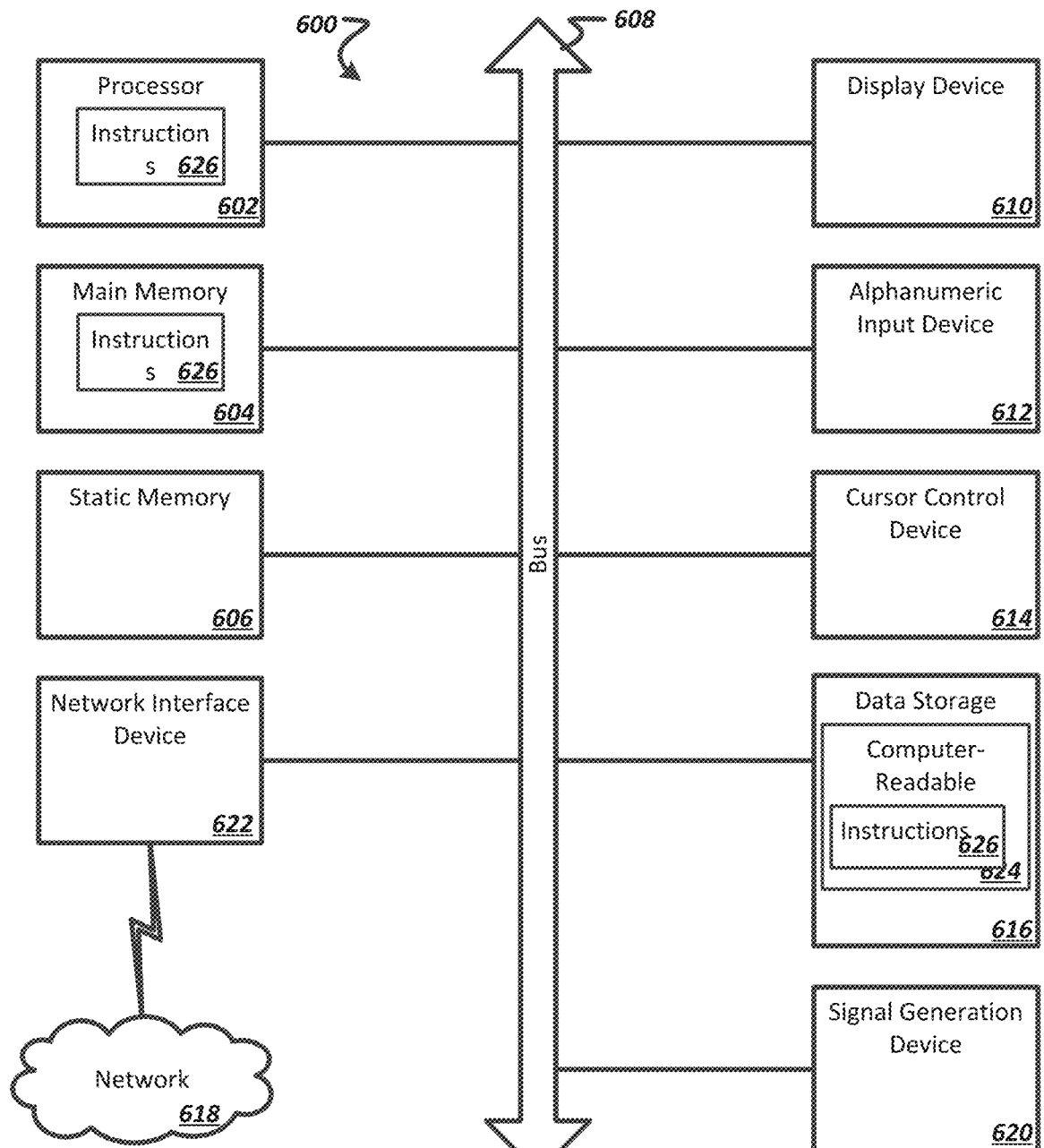
FIG. 6 illustrates an example computer system within which a set of instructions for performing any one or more of the methodologies discussed herein may be executed.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) etc.), a static memory 606 (e.g., flash memory, static random access memory (SRAM), etc.), and a data storage device 616, which communicate with each other via a bus 608.

Processing device 602 represents one or more general-purpose processing devices such as a microprocessor, a central processing unit, or the like, More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 is configured to execute instructions for performing the operations and steps discussed herein.

The computer system 600 may further include a network interface device 622 to communicate over the network 618. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse or a touch pad),), a signal generation device 620 (e.g., a speaker), a graphics processing unit (not shown), video processing unit (not shown), and audio processing unit (not shown).

The data storage device 616 may include a machine-readable storage medium 624 (also known as a computer-readable medium) on which is stored one or more sets of instructions or software embodying any one or more of the methodologies or functions described herein. The instructions may also reside, completely or at least partially, within the main memory 604 and/or within the processing device 602 during execution thereof by the computer system 600, the main memory 604 and the processing device 602 also constituting machine-readable storage media.

In one implementation, the instructions include instructions to implement functionality corresponding to a height difference determination. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "obtaining" or "associating" or "executing" or "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks. CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

What is claimed is:

1. A method comprising:
   acquiring one or more images of a device feature using an imaging tool, wherein the one or more images are top-down images;
   defining a geometrical shape encompassing relevant pixels of each image of the one or more images, wherein the geometrical shape is represented in terms of one or more parameters;
   defining a cost function whose variables comprise the one or more parameters of the geometrical shape;
   for each image, applying numerical optimization to obtain optimal values of the one or more parameters for which a value of the cost function is minimum; and
   providing the optimal values of the one or more parameters as metrology data pertaining to the device feature.

2. The method of claim 1, further comprising:
   prior to acquiring the one or more images, tuning imaging tool parameters to maximize signal to noise ratio of the one or more images.

3. The method of claim 1, wherein the geometrical shape comprises an ellipse, wherein the one or more parameters representing the ellipse comprises a major axis diameter of the ellipse, a minor axis diameter of the ellipse, coordinates of a center of the ellipse, and angular direction of the ellipse.

4. The method of claim 3, wherein the cost function is defined as:

$$\text{cost}(x,y,a,b,\theta) = \text{Values}(x,y,a,b,\theta) - \lambda \, \text{Area}(a,b)$$

where, a=major axis diameter of the ellipse,
b=minor axis diameter of the ellipse,
(x, y) are coordinates of a center of the ellipse,
$\theta$ is an angle between a horizontal axis and the major axis of the ellipse, indicating an angular direction of the ellipse,
Area=area of the ellipse; and
$\lambda$ is a tuning parameter for optimizing the cost function.

5. The method of claim 4, wherein the tuning parameter $\lambda$ controls tradeoff between the first term of the cost function (Values (x, y, a, b, $\theta$)) and the second term of the cost function ($\lambda$ Area(a, b)).

6. The method of claim 4, wherein the optimal values of the parameters of the ellipse for which the cost function is minimized represent the largest and the darkest ellipse that encompasses the relevant pixels in a relatively brighter background.

7. The method of claim 3, further comprising:
detecting an annulus of relatively brighter pixels in a relatively dark background in an image with low signal to noise ratio;
defining an inner ellipse and an outer ellipse that collectively constitute an elliptical ring that encompasses the annulus of the relatively brighter pixels; and
tailoring the cost function such that the numerical optimization yields one or more parameters of the elliptical ring.

8. The method of claim 3, wherein the device feature comprises a hole having a top opening, and a bottom surface that is partially obscured from being directly imaged by the imaging tool, wherein the top opening and the bottom surface are connected by sloped sidewalls.

9. The method of claim 8, further comprising:
obtaining known dimensions of the bottom surface of the hole from prior measurements;
defining a top ellipse and a bottom ellipse that respectively encompass a first set of pixels representing the top opening and a second set of pixels representing the bottom surface, wherein the bottom ellipse incorporates the known dimensions of the bottom surface obtained from the prior measurements; and
tailoring the cost function, such that the numerical optimization yields an offset value between the top ellipse and the bottom ellipse.

10. The method of claim 9, wherein incorporating the known dimensions to define the bottom ellipse compensates for the bottom surface being obscured from being directly imaged due to the sloped sidewalls.

11. A non-transitory machine-readable storage medium storing instructions which, when executed, cause a processing device to perform operations comprising:
defining a geometrical shape encompassing relevant pixels of each image of one or more images of a device feature acquired using an imaging tool, wherein the one or more images are top-down images, and wherein the geometrical shape is represented in terms of one or more parameters;
defining a cost function whose variables comprise the one or more parameters of the geometrical shape;
for each image, applying numerical optimization to obtain optimal values of the one or more parameters for which a value of the cost function is minimum; and
providing the optimal values of the one or more parameters as metrology data pertaining to the device feature.

12. The non-transitory machine-readable storage medium of claim 11, wherein the geometrical shape comprises an ellipse, wherein the one or more parameters representing the ellipse comprises a major axis diameter of the ellipse, a minor axis diameter of the ellipse, coordinates of a center of the ellipse, and angular direction of the ellipse.

13. The non-transitory machine-readable storage medium of claim 12, wherein the cost function is defined as:

$$\text{cost}(x,y,a,b,\theta) = \text{Values}(x,y,a,b,\theta) - \lambda \, \text{Area}(a,b)$$

where, a=major axis diameter of the ellipse,
b=minor axis diameter of the ellipse,
(x, y) are coordinates of a center of the ellipse,
$\theta$ is an angle between a horizontal axis and the major axis of the ellipse, indicating the angular direction of the ellipse,
Area=area of the ellipse; and
$\lambda$ is a tuning parameter for optimizing the cost function.

14. The non-transitory machine-readable storage medium of claim 12, wherein the optimal values of the parameters of the ellipse for which the cost function is minimized represent the largest and the darkest ellipse that encompasses the relevant pixels in a relatively brighter background.

15. The non-transitory machine-readable storage medium of claim 12, wherein the processing device further performs:
detecting an annulus of relatively brighter pixels in a relatively dark background in an image with low signal to noise ratio;
defining an inner ellipse and an outer ellipse that collectively constitute an elliptical ring that encompasses the annulus of the relatively brighter pixels; and
tailoring the cost function such that the numerical optimization yields one or more parameters of the elliptical ring.

16. The non-transitory machine-readable storage medium of claim 12, wherein the processing device further performs:
obtaining known dimensions of a bottom surface of a device feature from prior measurements, wherein the device feature comprises a hole having a top opening, and the bottom surface that is partially obscured from being directly imaged by the imaging tool, wherein the top opening and the bottom surface are connected by sloped sidewalls;
defining a top ellipse and a bottom ellipse that respectively encompass a first set of pixels representing the top opening and a second set of pixels representing the bottom surface, wherein the bottom ellipse incorporates the known dimensions of the bottom surface obtained from the prior measurements; and
tailoring the cost function, such that the numerical optimization yields an offset value between the top ellipse and the bottom ellipse.

17. A system comprising a memory and a processing device coupled to the memory, wherein the processing device performs the following operations:
obtaining one or more images of a device feature, wherein the one or more images are top-down images;
defining a geometrical shape encompassing relevant pixels of each image of the one or more images, wherein the geometrical shape is represented in terms of one or more parameters;
defining a cost function whose variables comprise the one or more parameters of the geometrical shape;

for each image, applying numerical optimization to obtain optimal values of the one or more parameters for which a value of the cost function is minimum; and providing the optimal values of the one or more parameters as metrology data pertaining to the device feature.

18. The system of claim 17, further comprising:
an imaging tool that acquires the one or more images and send the one or more images to the processing device, wherein prior to acquiring the one or more images, imaging tool parameters are tuned to maximize signal to noise ratio of the one or more images.

19. The system of claim 17, wherein the geometrical shape comprises an ellipse, wherein the one or more parameters representing the ellipse comprises a major axis diameter of the ellipse, a minor axis diameter of the ellipse, coordinates of a center of the ellipse, and angular direction of the ellipse.

20. The system of claim 17, wherein the cost function can be tailored such that the numerical optimization yields one or more parameters of an elliptical ring that encompasses an annulus of relatively brighter pixels in a relatively dark background in an image with low signal to noise ratio.

* * * * *